US006822345B2

(12) United States Patent
Gauthier et al.

(10) Patent No.: US 6,822,345 B2
(45) Date of Patent: Nov. 23, 2004

(54) CHIP/PACKAGE RESONANCE DAMPING USING CONTROLLED PACKAGE SERIES RESISTANCE

(75) Inventors: Claude Gauthier, Fremont, CA (US); Brian Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 178 days.

(21) Appl. No.: 10/118,840

(22) Filed: Apr. 9, 2002

(65) Prior Publication Data

US 2003/0197430 A1 Oct. 23, 2003

(51) Int. Cl.$^7$ .......................... H02J 7/00; G11C 27/02; H03H 1/00
(52) U.S. Cl. .................. 307/64; 323/369; 327/108
(58) Field of Search ................. 307/64, 80, 102; 327/108; 323/208, 293, 364, 369, 370

(56) References Cited

U.S. PATENT DOCUMENTS 4,689,550 A * 8/1987 Ujihara et al. ............. 323/370
5,319,263 A * 6/1994 Kannegundla et al. ..... 327/524
6,087,823 A * 7/2000 Sekiguchi et al. ......... 323/364

OTHER PUBLICATIONS

"An On–Chip Voltage Regulator Using Switched Decoupling Capacitors" Presented by: M. Ang. R. Salem and A. Taylor of Sun Microsystems, Inc. on Wednesday, Feb. 9, 2000 At the "2000 IEEE International Solid–State Circuits Conference" (conference dates Feb. 7, 8, 9, 2000) (15 pages).*

* cited by examiner

Primary Examiner—Jessica Han
(74) Attorney, Agent, or Firm—Osha & May L.L.P.

(57) ABSTRACT

A method and apparatus for reducing an impedance of a power supply path of an integrated circuit is provided. The power supply path includes a first power supply line and a second power supply line to provide power to the integrated circuit. At least one resistive element connected between the first power supply line and the second power supply line is adjusted to reduce the impedance of the power supply path.

13 Claims, 6 Drawing Sheets

CHIP/PACKAGE RESONANCE DAMPING USING CONTROLLED PACKAGE SERIES RESISTANCE

BACKGROUND OF INVENTION

Power supplied to a central processing unit (CPU) occurs through a power distribution network. The power distribution network starts with a power supply that generates an appropriate DC voltage. The power supplied to the CPU must traverse from the power supply and across the power distribution network before it reaches the CPU. The power distribution network has characteristics that may affect the operation of the CPU.

FIG. 1 shows a prior art depiction of a CPU system (10). The CPU system (10) includes a printed circuit board (PCB) (12). The PCB (12) is a central platform on which various components are mounted. The PCB (12) has multiple layers that contain traces that connect the power supply and signals to the various components mounted on the PCB (12). Two layers, a system power supply layer (14) and a system ground layer (16), are shown in FIG. 1.

The system power supply layer (14) and the system ground layer (16) provide power to a CPU (20). The power supplied to the CPU (20) must traverse from a DC source (not shown) and across the system power supply layer (14) and the system ground layer (16) to a package (18) on which the CPU (20) is mounted. Other components are also mounted on the PCB (12) that generally attempt to maintain a constant voltage supplied to the CPU (20). These components may include, but are not limited to, an air-core inductor (24), a power supply regulating integrated circuit (26), switching transistors (28), a tantalum capacitor (30), and electrolytic capacitors (32).

In FIG. 1, the power supplied to the CPU (20) traverses from the DC source (not shown) and across the power distribution network created by the system power supply layer (14) and the system ground layer (16). Each layer (14, 16) creates a plane within the PCB (12). A variety of different types and different locations of capacitors are used to help maintain a constant voltage supplied to the CPU (20). Electrolytic capacitors (32) mounted on the PCB (12) connect between the system power supply layer (14) and the system ground layer (16). The package (18), similar to the PCB, may include multiple planes and interconnections between the planes to provide a connective substrate in which power and signals traverse. Ceramic capacitors (22) mounted on the package (18) connect between a system power supply (not shown) and a system ground (not shown). Ceramic capacitors (22), local to the CPU (20), may help maintain a constant voltage near the CPU (20).

Due to active switching of circuit elements on the CPU (20), the power a required by the CPU (20) changes. The active switching causes power supply noise. The addition of components attempts to minimize the power supply noise generated by the CPU. For example, ceramic capacitors (22) near the CPU (20) act as local power supplies by storing charge. Although the addition of components helps reduce the power supply noise, the impedance of the power distribution network may cause chip/package resonance. Chip/package resonance may cause oscillations in the system power supply. The resonances are formed by the parasitics (i.e., inductance, resistance, capacitance) included in the CPU (20) (i.e., chip, integrated circuit), package (18), and power distribution network. In particular, the resonance may be formed from a parasitic tank circuit that includes the chip capacitance and package inductance.

FIG. 2 shows a prior art schematic of a power distribution network for a CPU. A DC power supply (202) is shown at the left. Two power supply lines (292, 294) supply power to a CPU located between the two power supply lines (292, 294). The circuit elements between the DC power supply (202) and the power supply lines (292, 294) model both the inherent parasitics of the power distribution network and added components.

In FIG. 2, the DC power supply (202) connects to the power distribution network through a power supply connector. The power supply connector has inherent parasitics modeled by resistors (204, 208) and inductors (206, 210). The electrolytic capacitors (32 in FIG. 1) are represented as bulk capacitors in FIG. 2. Capacitors do not only have a capacitive behavior but also a small resistive and inductive behavior. The inductor (212), resistor (214), and capacitor (216) model the bulk capacitors. The parasitic behavior of the PCB planes (system power supply layer (14) and system ground layer (16) in FIG. 1) is modeled as resistors (218, 222) and inductors (220, 224).

In FIG. 2, the power distribution network may include multiple power supply planes and connections to a package (or multiple packages). The inherent series parasitics of the power distribution network are modeled by resistors (232, 236, 240, 244) and inductors (234, 238, 242, 246).

Multiple planes and interconnections between the planes may create parasitics in parallel with the power supply. In FIG. 2, inherent parallel parasitics created by the power distribution network are modeled. Also, additional capacitance in parallel with the power supply may help maintain a constant voltage. The additional capacitance may be connected between the power supply planes, for example, ceramic capacitors may connect between the system power supply plane and system ground plane. The inductance (226), resistance (228), and capacitance (230) model some of the parasitics in parallel with the power supply (202). Additional inherent parasitics and added capacitance local to the CPU may be modeled. The ceramic capacitors (22 in FIG. 1) and other inherent parasitics created by the package multiple planes and interconnections are modeled by inductor (248), resistor (250), and capacitor (252).

A package may connect to a CPU using a grid of solder bumps. In FIG. 2, the inherent parasitics created by the solder bumps are modeled by inductors (254, 258) and resistors (256, 260). On the CPU, various forms of chip capacitance may be used to further stabilize the power supply. Low equivalent series resistance (ESR) local decoupling capacitors are modeled by resistor (262) and capacitor (264). High ESR global decoupling capacitors are modeled by resistor (266) and capacitor (268). Non-switching logic on the CPU is modeled by resistor (270) and capacitors (272, 274). Switching logic on the CPU is modeled by variable resistors (276, 278) and capacitors (280, 282).

In FIG. 2, the schematic of the power distribution network may be used to simulate the impedance observed by the CPU, as represented by "Z." To simulate the impedance, a 1 Ampere AC current source (290) injects current onto power supply line (292). The measured voltage, $V_M$, between two power supply lines (292, 294) may be used to calculate the impedance. The impedance Z is equal to $V_M$ divided by 1 Ampere. By varying the frequency of the 1 Ampere AC current source (290), a frequency versus impedance graph may be drawn. Over a particular range of frequencies, the impedance increases because the circuit formed by the chip and package resonates. The resonance from the chip and package may lead to undesirable effects on the CPU operation.

SUMMARY OF INVENTION

According to one aspect of the present invention, an apparatus for reducing a power supply impedance of an integrated circuit comprises a package on which the integrated circuit is mounted; a power supply path on the package adapted to receive power from a power supply where the power supply path comprises a first power supply line and a second power supply line to provide power to the integrated circuit; and at least one resistive element connected between the first power supply line and the second power supply line where the at least one resistive element comprises a potentiometer to reduce the power supply impedance of the integrated circuit.

According to one aspect of the present invention, a method for reducing an impedance of a power supply path of an integrated circuit where the power supply path comprises a first power supply line and a second power supply line, the method comprises determining an impedance of the power supply path of the integrated circuit, and adjusting a value of a resistance connected between the first power supply line and the second power supply line to reduce the impedance of the power supply path.

Other aspects and advantages of the invention will be apparent from the following description and the appended claims.

DETAILED DESCRIPTION

Embodiments of the present invention relate to an apparatus for reducing a power supply impedance of an integrated circuit. Embodiments of the present invention further relate to a method for reducing a power supply impedance of an integrated circuit.

More particularly, embodiments of the present invention relate to reducing a power supply impedance of an integrated circuit that is connected to a power supply via two power supply lines. At least one resistive element is connected across the two power supply lines, and the at least one resistive element reduces the power supply impedance of the integrated circuit. The resistive element may include a resistor, potentiometer, and/or a controlled, inherent resistance from a capacitor or signal trace.

Figure 2A:
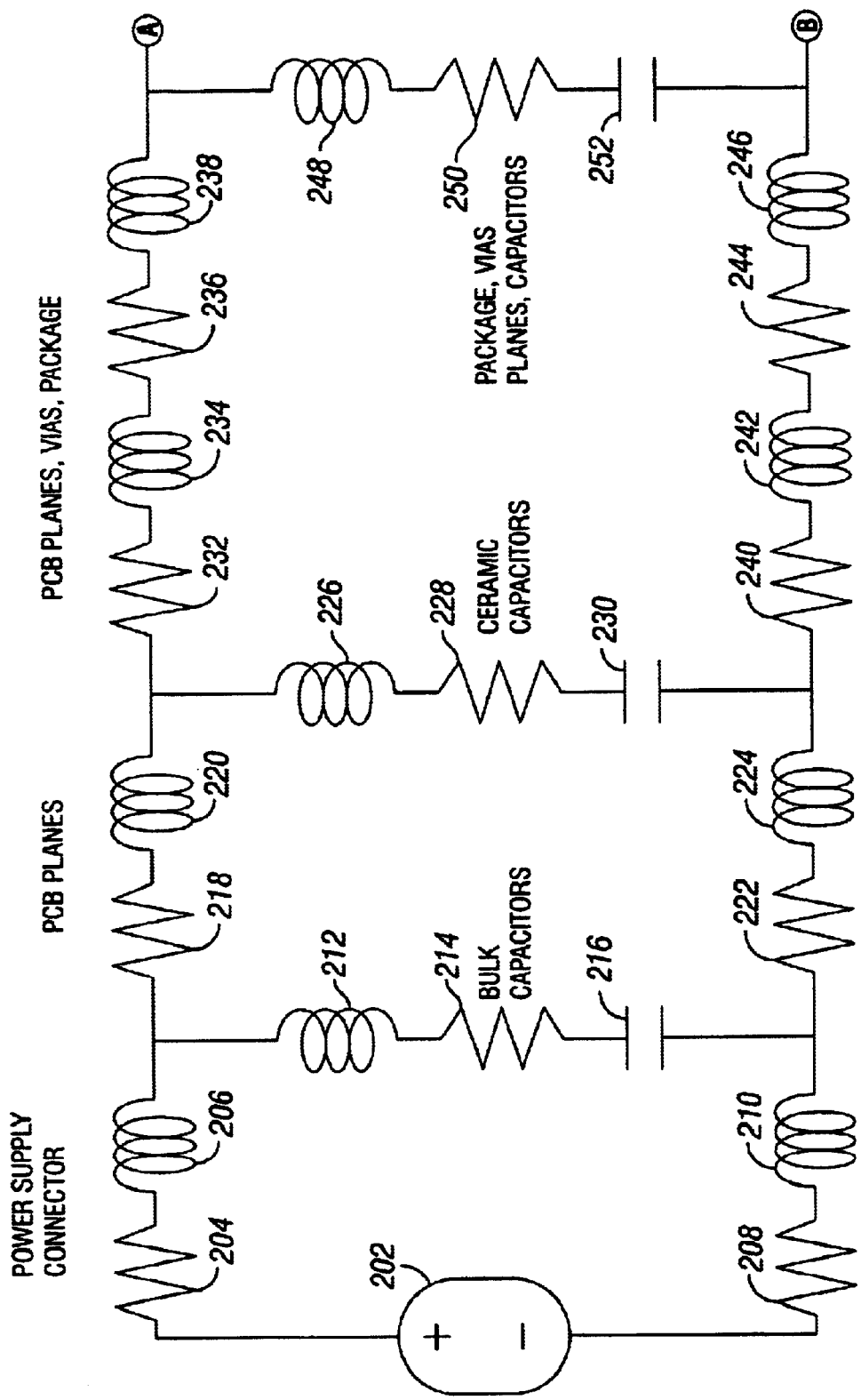
FIG. 2 shows a prior art schematic of a power distribution network for a central processing unit.
Figure 2B:
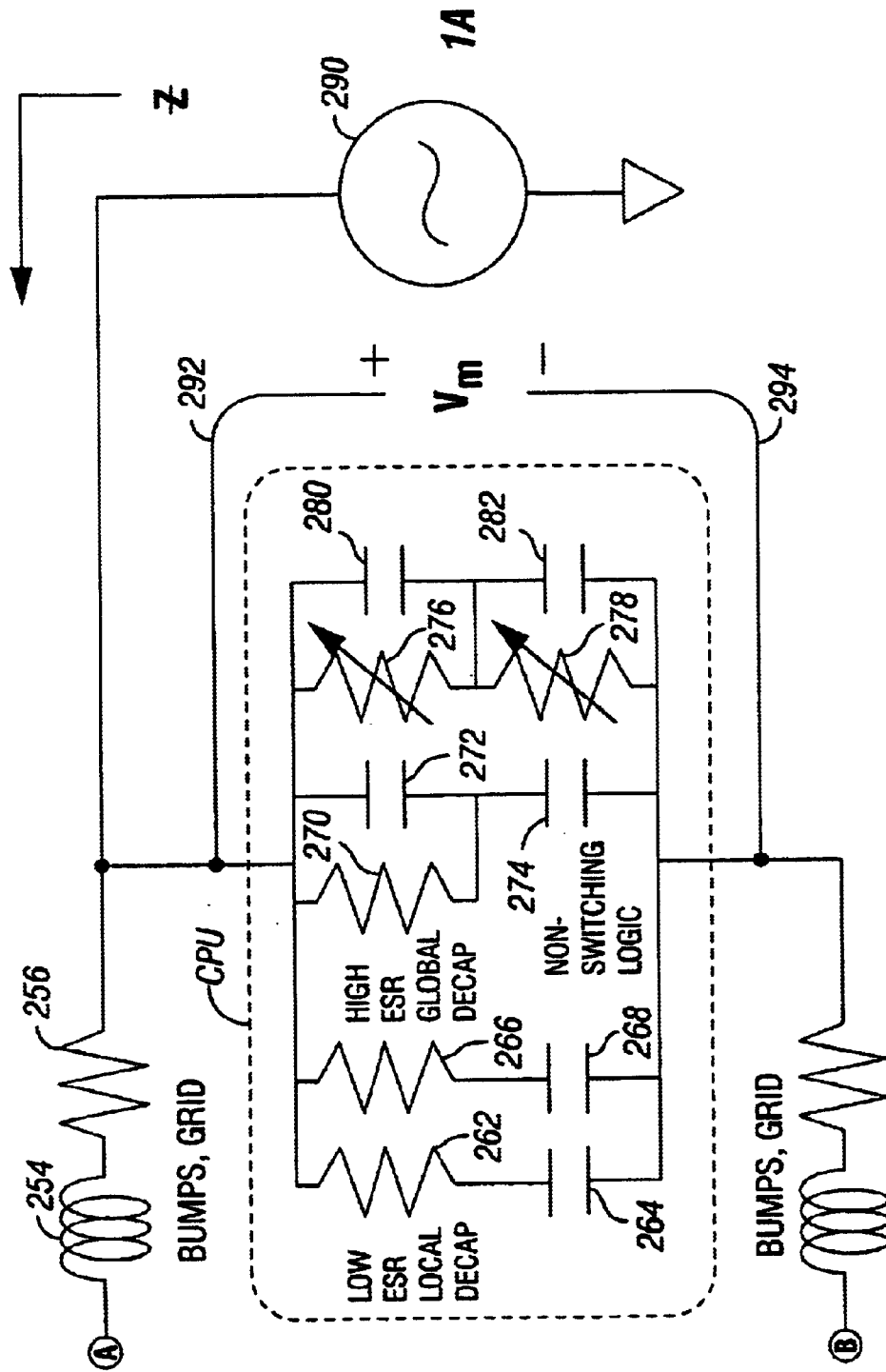

In FIG. 2, a prior art schematic of a power distribution network for a CPU is shown. The CPU is representative of any integrated circuit. The integrated circuit is powered through two power supply lines (292, 294). In practice, multiple power supply lines may be used to provide adequate current capacity. Multiple power supply lines typically have a common source at some point in the circuit.

In FIG. 2, a representative inductor (248), resistor (250), and capacitor (252) model the inherent parasitics created by the package and added capacitance between the two power supply lines (292, 294). The added capacitance is used to minimize the power supply noise created by the active switching of the integrated circuit. The inductor (248), resistor (250), and capacitor (252) in parallel with the integrated circuit parasitics and solder bump parasitics may form a circuit that will resonate at a frequency. The resonance, which is observed as a change in impedance, may be determined through simulation or laboratory experiments.

To determine the impedance represented by Z observed by the integrated circuit, a 1 Ampere AC current source (290) is used to excite the circuit shown in FIG. 2. As the frequency of the AC current source is varied, the measured voltage ($V_M$) between the two power supply lines (292, 294) is measured. The impedance may be determined by dividing the measured voltage, $V_M$, by the 1 Ampere AC current source (290) (i.e., Ohm's law).

Figure 4:
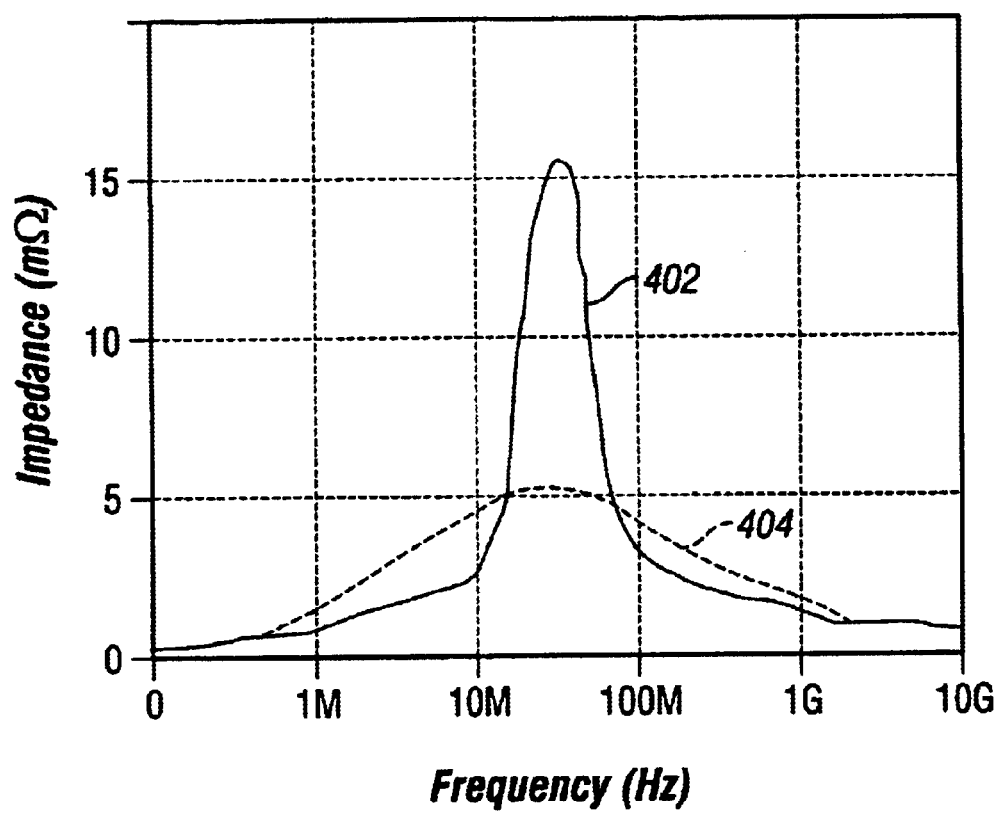
FIG. 4 shows a graph depicting the power supply system impedance of the circuit shown in FIGS. 2 and 3 in accordance with an embodiment of the present invention.

In FIG. 4, a representative drawing of the impedance (Z) as observed by the integrated circuit in FIG. 2 at different frequencies is shown with the graph (402). The impedance peaks typically between 10 MHz and 100 MHz. The inherent parasitics of the integrated circuit and package on which the integrated circuit is mounted interact with the inherent parasitics and added components of the power distribution network. The increase in impedance as observed by the integrated circuit occurs because a circuit created by the integrated circuit and package resonates. The inductor (248), resistor (250), and capacitor (252) that model the parasitics of the package may have a large effect on the amount of resonance.

Figure 3A:
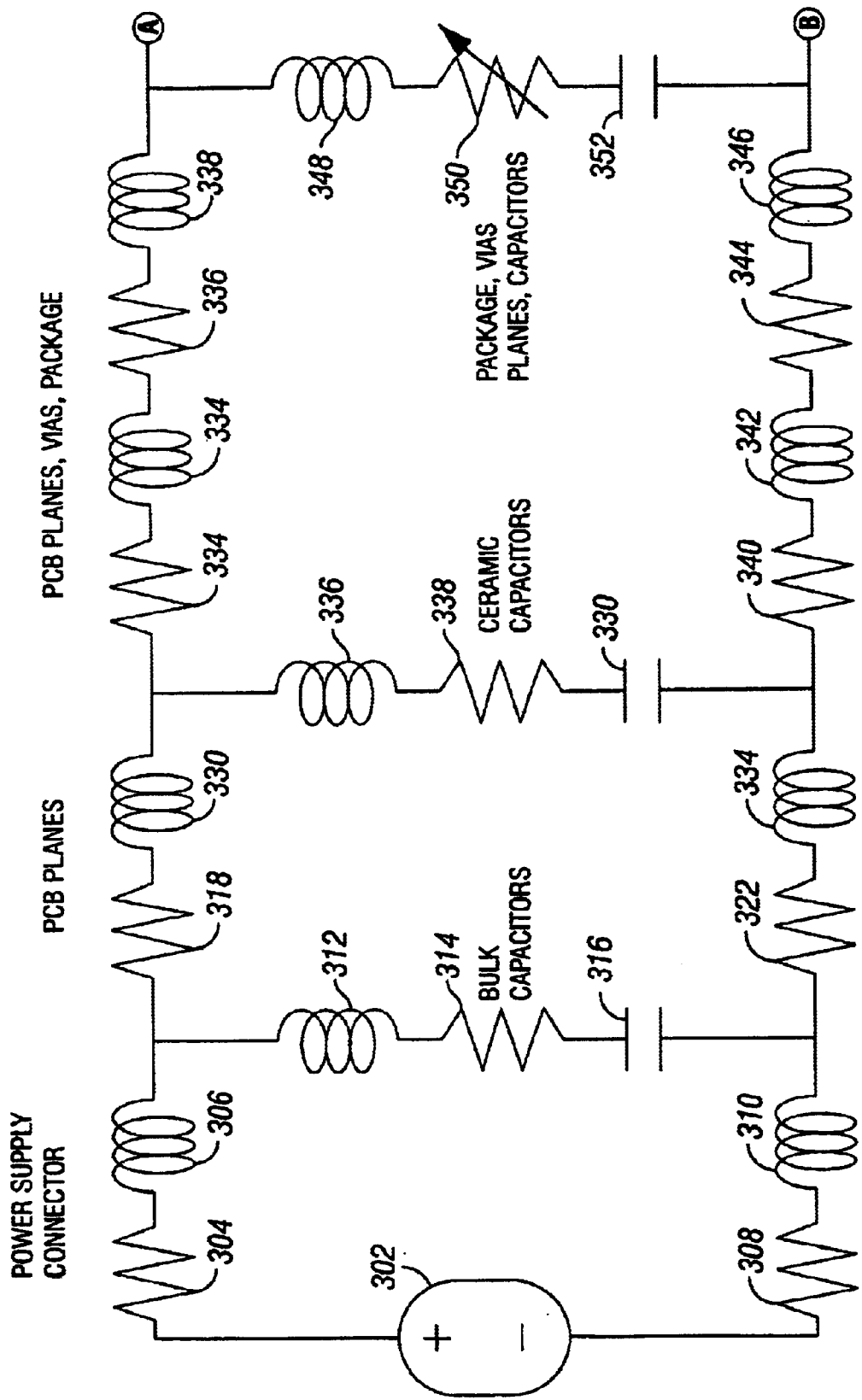
FIG. 3 shows a schematic of a power distribution network for a central processing unit in accordance with an embodiment of the present invention.
Figure 3B:
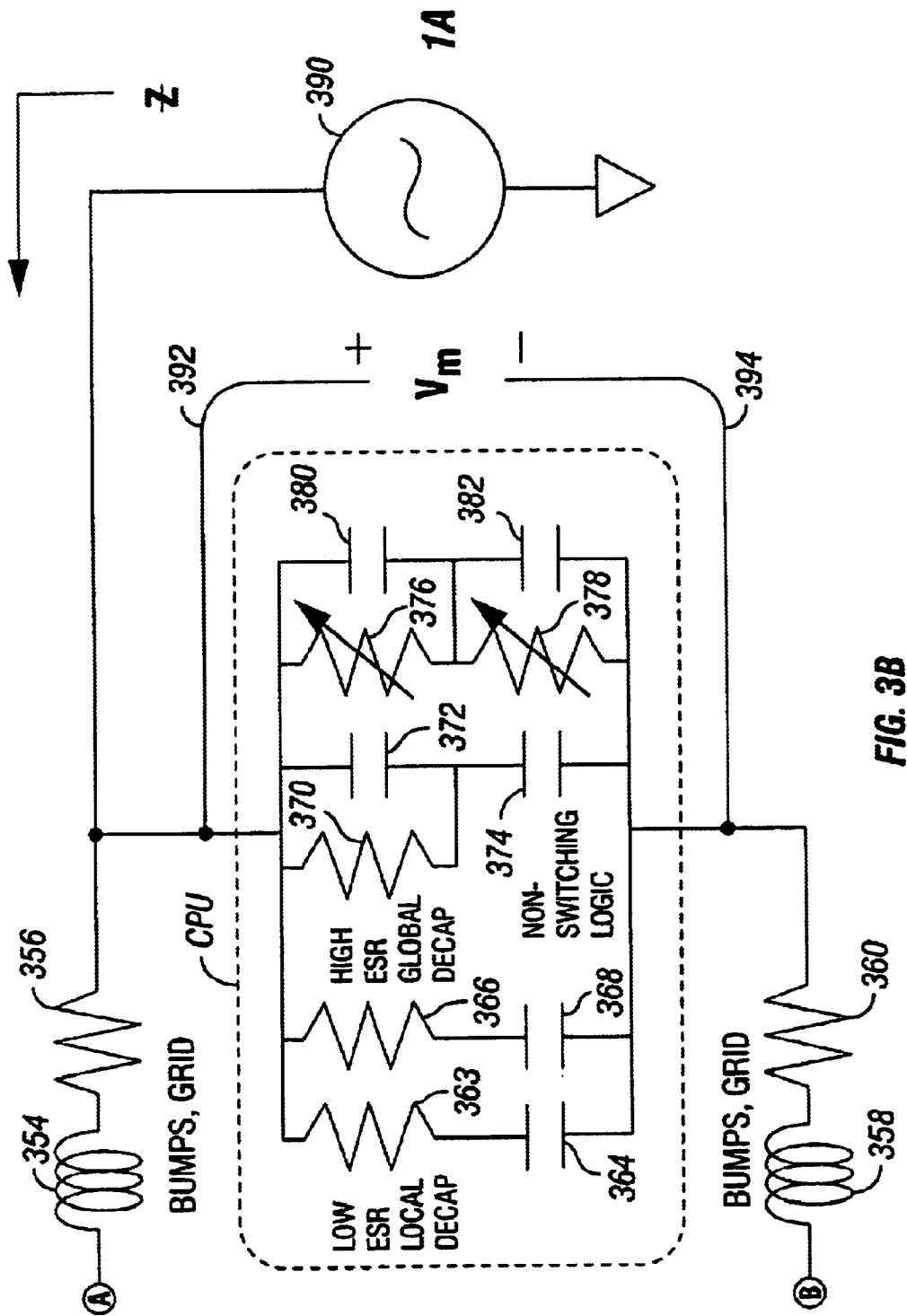

In FIG. 3, the inherent parasitics and added components are similar to the inherent parasitics and added components shown in FIG. 2. According to an embodiment of the present invention, the resistor (350) that models the resistance included in the package inductance (348), resistance (350), and capacitance (352) may be used to reduce the chip/package resonance. The inductance (348), resistance (350), and capacitance (352) are the result of inherent and added parasitics from a power supply path on the package. The parasitics from the package included package vias (connections between power supply traces) and package planes. The package may include signal and power connection created by using signal and power supply traces. The signal and power supply traces may be arranged in planes. The planes may connect to other planes using vias. The inductance (348), resistance (350), and capacitance (352) are also the result of added capacitors on the package.

Figure 1:
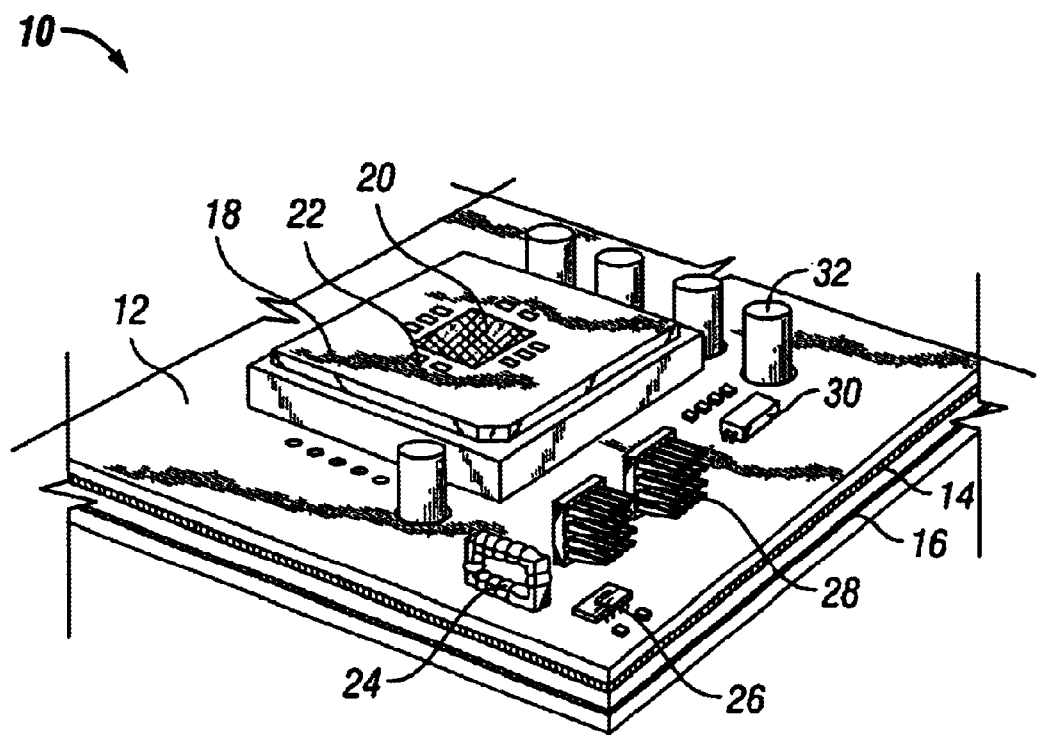
FIG. 1 shows a prior art depiction of a central processing unit system.

In FIG. 2, the resistance (250) is designed to be low to allow the on-chip capacitor, for example the ceramic capacitors (22 in FIG. 1) near the CPU (20 in FIG. 1), to quickly respond to any power supply noise. As shown in FIG. 4 with the graph (402), however, the parasitic tank circuit may increase the impedance through chip/package resonance. The graph (402) has a high Q factor, or quality factor. The quality of a signal, or Q factor, is a measure of the signal's maximum compared to the signal's width. A low Q factor is desirable because a low impedance improves the current flow to an integrated circuit.

In FIG. 3, the resistance (350) is increased compared to the resistance (250) in FIG. 2. An appropriately selected value for the resistance (350) changes the chip/package resonance. As a result of an embodiment of the present invention, FIG. 4 displays a representative graph (404) of the impedance as observed by the integrated circuit at Z in FIG. 3 at different frequencies using an appropriately selected value for the resistance (350). The graph (404) of the impedance has a reduced peak compared to graph (402).

The increased resistance (350) creates a damping effect on the amount of resonance. An increase in the resistance value of the resistive element (350 in FIG. 3) will reduce the peak (Q factor) of the impedance Z observed by the integrated circuit.

Those with ordinary skill in the art will appreciate that the resistance (350), or resistive element, may be a resistance formed from a resistor or potentiometer. The resistance (350), or resistive element, may also be formed from the equivalent series resistance that is inherent in a capacitor. The resistance (350), or resistive element, may further be formed from the power supply traces (or connections) that connect components (e.g., resistors, inductors, capacitors) to the power distribution network, the package, and ultimately to the integrated circuit. Resistance of a power supply trace may adjusted by selecting or varying the width, thickness, length, and/or metallurgical properties of the power supply trace. Also, the number of traces and the number of connections (e.g., vias) between traces on different planes may be used to select the resistance.

Those with ordinary skill in the art will appreciate that the resistance (350), or resistive element, connects between two power supply lines. A power supply line may be composed of multiple power supply traces. Each power supply trace may have a similar voltage and may originate from a common source. The resistance (350) may be connected to any of the multiple power supply traces to create a connection to the power supply line.

Those skilled in the art will appreciate that selecting an appropriate resistance may include considering the contribution of several resistive elements. The method of selecting an appropriate resistance may occur through simulation, adjustment of a circuit element, and/or selection of a resistance from several preset values. The selection may occur in the design process or at the time of manufacture.

Advantages of the present invention may include one or more of the following. In some embodiments, because a resistive element is selected, the chip/package peak impedance may be reduced. A capacitor with a higher equivalent series inductance may be used with a resistive element that dampens the peak impedance created by the increased inductance. The capacitor with a higher equivalent series inductance may be less expensive than the capacitor with a lower equivalent series inductance.

Other advantages of the present invention may include one or more of the following. A value of the resistive element may be selected using simulation. The value of the resistive element may be selected as part of the manufacture of the package. The value of the resistive element may be selected after measuring parameters from the integrated circuit, integrated circuit package, and/or power distribution network.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for reducing a power supply impedance of an integrated circuit, comprising:

a package on which the integrated circuit is mounted;

a power supply path on the package adapted to receive power from a power supply, wherein the power supply path comprises a first power supply line and a second power supply line to provide power to the integrated circuit; and at least one resistive element connected between the first power supply line and the second power supply line, wherein the at least one resistive element comprises a potentiometer to reduce the power supply impedance of the integrated circuit.

2. A method for reducing an impedance of a power supply path of an integrated circuit, wherein the power supply path comprises a first power supply line and a second power supply line, the method comprising:

determining an impedance of the power supply path of the integrated circuit; and adjusting a value of a resistance connected between the first power supply line and the second power supply line to reduce the impedance of the power supply path.

3. The method of claim 2, wherein adjusting the value of the resistance comprises using a resistor.

4. The method of claim 2, wherein adjusting the value of the resistance comprises using a potentiometer.

5. The method of claim 2, wherein adjusting the value of the resistance comprises using an equivalent series resistance of a capacitor.

6. The method of claim 2, wherein adjusting the value of the resistance comprises using a power supply trace.

7. The method of claim 6, wherein adjusting the value of the resistance comprises selecting a width of the power supply trace.

8. The method of claim 6, wherein adjusting the value of the resistance comprises selecting a thickness of the power supply trace.

9. The method of claim 6, wherein adjusting the value of the resistance comprises selecting a length of the power supply trace.

10. The method of claim 6, wherein adjusting the value of the resistance comprises selecting a metallurgical property of the power supply trace.

11. The method of claim 6, wherein adjusting the value of the resistance comprises determining a number of connections used to connect the power supply trace.

12. The method of claim 2, wherein determining the impedance of the power supply path comprises applying a current source to the integrated circuit and measures a voltage across the integrated circuit.

13. An apparatus for reducing an impedance of a power supply path of an integrated circuit connected to the power supply path, wherein the power supply path comprises a first power supply line and a second power supply line, the apparatus comprising:

means for determining an impedance the power supply path of the integrated circuit; and means for adjusting a value of a resistance connected between the first power supply line and the second power supply line to reduce the impedance of the power supply path.

* * * * *